(12) United States Patent
Twerdochlib (10) Patent No.: US 8,008,925 B2
(45) Date of Patent: Aug. 30, 2011

(54) ELECTRICAL PARTIAL DISCHARGE PULSE MARKER DISCRIMINATION

(75) Inventor: Michael Twerdochlib, Oviedo, FL (US)

(73) Assignee: Siemens Energy, Inc., Orlando, FL (US)

( * ) Notice: Subject to any disclaimer, the term of this patent is extended or adjusted under 35 U.S.C. 154(b) by 638 days.

(21) Appl. No.: 12/174,292

(22) Filed: Jul. 16, 2008

(65) Prior Publication Data
US 2010/0013494 A1 Jan. 21, 2010

(51) Int. Cl.
*G01R 31/12* (2006.01)
*H01H 9/50* (2006.01)
(52) U.S. Cl. ........................................ 324/536; 324/551
(58) Field of Classification Search .................. 324/536, 324/551
See application file for complete search history.

(56) References Cited

U.S. PATENT DOCUMENTS

| | | | |
|---|---|---|---|
| 3,609,533 A | 9/1971 | Pardis | |
| 4,949,001 A | 8/1990 | Campbell | |
| 5,272,439 A | 12/1993 | Mashikian et al. | |
| 5,416,418 A | 5/1995 | Maureira et al. | |
| 5,814,998 A | 9/1998 | Gruenewald et al. | |
| 5,933,012 A * | 8/1999 | Bengtsson et al. | 324/524 |
| 6,822,457 B2 | 11/2004 | Borchert et al. | |
| 2002/0053914 A1 * | 5/2002 | Dring et al. | 324/536 |

* cited by examiner

*Primary Examiner* — Amy He (57) ABSTRACT

A marker pulse discriminator monitor that enables filtering of partial discharge pulses for monitoring the condition of a generator in a power plant system. The monitor detects partial discharge pulses emanating from the generator and includes a plurality of first modules connected to respective isophase buses adjacent to the generator. Each of the first modules generate a marker pulse in response to a partial discharge pulse. The monitor also includes an analyzer unit connected to the isophase buses adjacent to a step-up transformer. The analyzer unit receives each partial discharge pulse and each marker pulse and determines a differential value corresponding to a difference between a time of arrival of a partial discharge pulse and a time of arrival of a corresponding marker pulse to identify partial discharge pulses originating at the generator and to identify the isophase bus associated with the corresponding partial discharge pulse.

18 Claims, 4 Drawing Sheets

ELECTRICAL PARTIAL DISCHARGE PULSE MARKER DISCRIMINATION

FIELD OF THE INVENTION

The present invention relates to high voltage power generation equipment and, more particularly, to the detection of partial discharge pulses emanating from an electrical generator.

BACKGROUND OF THE INVENTION

Dynamoelectric high-voltage machines and/or high-voltage systems, such as electrical generators in power plants, represent capital intensive installations, and require a high availability in order to be operated as economically as possible. One expedient for enhancing the availability of generators is early detection of impending damage in the individual system parts. The extent of possible damage can be limited by timely detection of an impending fault, it being possible to avoid severe damage to the generator, as well as to avoid unscheduled down times.

It is known that faults in electrical systems or system components make themselves known well before the occurrence of the actual damage by forming partial discharges or break sparks. Accordingly, it is common to monitor power plant generators, either continuously or at regular intervals to identify the occurrence of partial discharges that could be indicative of impending component failure. This mode of operation permits reliable early detection of faults in electrical equipment.

In a partial discharge monitor currently implemented in power plants, partial discharge pulses are detected and quantified using two passive partial discharge couplers on each isophase bus, one coupler located adjacent to the generator and one coupler located adjacent to a step-up transformer. Alarms are issued based on total detected pulse activity that includes pulses from all sources, that is, from the entire plant, not just from within the generator. These monitors can not distinguish partial discharge pulses with regard to "point of origin". Typically, an expert on partial discharge analysis must then be sent to a site, i.e., a location in the power plant where partial discharge pulses have been sensed, and the expert must manually perform "time-of-flight" (TOF) analysis on a few of these pulses to determine the origin of the pulses.

In a TOF analysis, data captures at the generator and step-up transformer ends of the isophase bus are performed simultaneously. Two high speed digitizing circuits filter and capture decoupled high frequency partial discharge bus coupler signals at each bus site. Test personal must then switch the instrument to the next pair of isophase couplers and repeat data capture and analysis. Two high speed digitizing circuits may be used sequentially to reduce cost. A far better analysis is achieved when six such circuits are used to support simultaneous capture at all six sites. It is difficult to determine how many of these pulses are coming from the generator since clearly not all of the pulses can be manually tested in this manner. In many cases partial discharge activity is generated from sites other than the generator, posing no immediate threat to the plant and thus represents a false alarm.

Accordingly, there is a need for a method and monitor system for determining the location of partial discharge activity detected in an electrical conductor associated with a power plant generator. In particular, it is desirable to filter out partial discharge activity detected in a conductor that does not emanate from a generator.

SUMMARY OF THE INVENTION

In accordance with one aspect of the invention, a method is provided for detecting partial discharge pulses emanating from a generator on a conductor. The method comprises the steps of detecting a partial discharge pulse on the conductor at a first module; detecting the partial discharge pulse on the conductor at a second module; generating a marker pulse on the conductor at the first module in response to the detection of the partial discharge pulse at the first module; detecting the marker pulse on the conductor at the second module; determining a differential value corresponding to a difference between a time of arrival of the partial discharge pulse at the second module and a time of arrival of the marker pulse at the second module; and using the differential value to identify whether the partial discharge pulse originated at the generator.

In accordance with another aspect of the invention, a method is provided for use in a system comprising an electrical generator connected to a step-up transformer by a conductor comprising a plurality of isophase buses, and a monitor comprising a plurality of first modules connected to respective isophase buses adjacent to the generator and an analyzer unit including one or more second modules connected to the isophase buses adjacent to the step-up transformer. The method detects partial discharge pulses emanating from the generator and comprises the steps of detecting one or more partial discharge pulses at respective first modules; detecting the one or more partial discharge pulses at the analyzer unit; generating a marker pulse for each of the one or more partial discharge pulses at the respective first modules; detecting each marker pulse at the analyzer unit; for each marker pulse, determining a differential value corresponding to a difference between a time of arrival of the partial discharge pulse at the analyzer unit and a time of arrival of a corresponding marker pulse at the analyzer unit; and using each differential value to identify whether a corresponding partial discharge pulse originated at the generator and to identify the isophase bus associated with the corresponding partial discharge pulse.

In accordance with a further aspect of the invention, a monitor is provided in combination with a system comprising an electrical generator connected to a step-up transformer by a conductor comprising a plurality of isophase buses. The monitor is provided for detecting partial discharge pulses emanating from the generator and comprises a plurality of first modules connected to respective isophase buses adjacent to the generator, each of the first modules generating a marker pulse in response to a partial discharge pulse. The monitor further includes an analyzer unit including one or more second modules connected to the isophase buses adjacent to the step-up transformer. The analyzer unit receives each partial discharge pulse and each marker pulse and determines a differential value corresponding to a difference between a time of arrival of a partial discharge pulse and a time of arrival of a corresponding marker pulse to identify a partial discharge pulse originating at the generator and to identify the isophase bus associated with the corresponding partial discharge pulse.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

DETAILED DESCRIPTION OF THE INVENTION

In the following detailed description of the preferred embodiment, reference is made to the accompanying drawings that form a part hereof and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
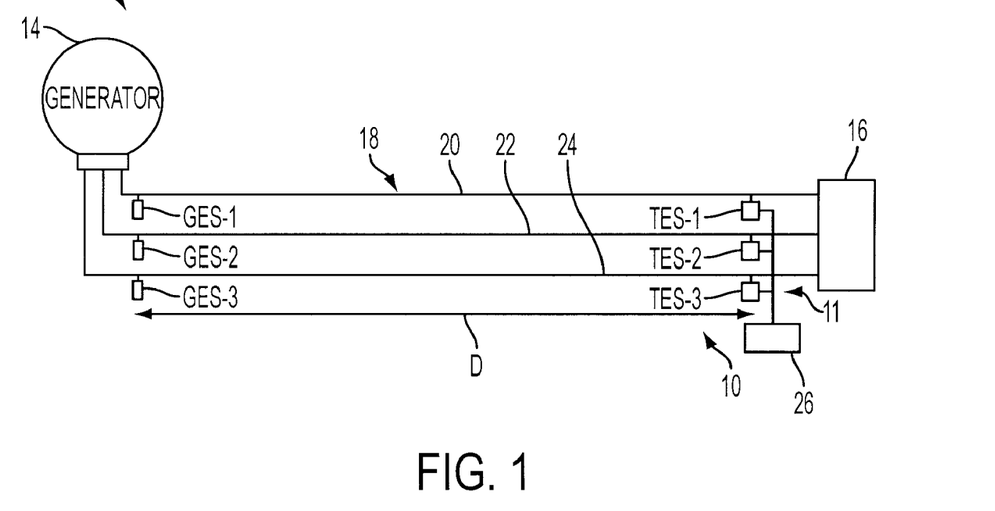
FIG. 1 is a diagrammatic view of a power plant system including a marker pulse discriminator monitor for performing the present invention.

Referring to FIG. 1, the present invention provides a pulse marker discriminator monitor or PMD 10 that enables filtering of partial discharge pulses for use in a power plant system 12. The power plant system 12 may comprise an electrical generator 14 connected to a step-up transformer 16 by an electrical conductor 18, where the electrical conductor 18 comprises a plurality of isophase buses including a first isophase bus 20, a second isophase bus 22 and a third isophase bus 24. Each isophase bus of the conductor 18 conducts a different phase of a 60 Hz voltage signal from the generator 14 to the step-up transformer 16. As is described in detail below, the PMD 10 is connected to the conductor 18 to identify and filter out partial discharge (PD) pulses that do not originate at the generator 14, i.e., PD pulses from sources external to the generator 14, in order to eliminate or reduce false alarms, and provide an accurate indication of the internal generator PD activity.

The PMD 10 comprises two standard PD couplers, such as are currently used in known PD monitoring systems, located at each end of each isophase bus 20, 22, 24. In particular, a first, generator end bus coupler or GES module is located adjacent to the generator end of each isophase bus 20, 22, 24 and labeled GES-1, GES-2, GES-3, respectively, and referred to collectively as GES modules. A second, transformer end bus coupler or TES module is located adjacent to the transformer end of each isophase bus 20, 22, 24 and labeled TES-1, TES-2, TES-3, respectively, and referred to collectively as TES modules. The TES modules define an analyzer unit 11 for the PMD 10, and the TES modules each perform a data capture and analysis function and provide an output to a remote input/output (I/O) unit 26, such as a remote display, which may additionally perform analysis functions.

It should be noted that the modules for performing the functions described for the present invention may be built directly into the respective bus couplers, and the terms "coupler" and "module" are used interchangeably herein.

It should also be understood that a data capture and analysis function is performed on signals received by the TES modules, i.e., either directly at the TES modules (first embodiment of the invention) or at the remote I/O unit 26 (second and third embodiments of the invention), and that the GES modules do not include or require a data capture and analysis capability. This may be contrasted with known PD monitors that require data capture and analysis at both the generator end (GES) bus couplers and at the transformer end (TES) bus couplers. Hence, it may be recognized in the following description that the hardware requirements of the PMD 10 are minimized with an associated reduction in cost.

In a first embodiment of the invention, each of the TES modules include a high speed digitizer board, where each TES module TES-1, TES-2, TES-3 performs a data capture and analysis operation on a respective isophase bus 20, 22, 24. In the described embodiment, the TES modules include a clock that generates an 80 MHz clock pulse signal. It may be noted that, the clock provided in the TES modules may generate clock pulse signals at much higher frequencies, such as 200 MHz. Each TES module additionally includes a signal filtering and high speed digitizer circuit, as is known in the art. In a practical application of the invention, all three TES modules may share a single system clock signal. The TES and GES modules may comprise any commercially available partial discharge monitor such as, for example, Siemens HF 10-2, PDTech CC7 and CC20, Iris Power BusGuard, LDIC PD-Guard and PD DC-24, and mtronix MPD402 monitoring devices.

The 80 MHz clock pulses have a time separation of $ts( )=(1/80,000,000)$ sec=12 nanoseconds. Hence, for each 60 Hz cycle from the generator 14, there are 80,000,000/60=1,333,333 such "ts( )" pulses. For the purposes of this description, these clock pulse are numbered 1 through 1,333,333, i.e., $ts(1), ts(2) \ldots ts(1,333,333)$, with $ts(1)$ being at the zero volt, rising slope, of the voltage signal in the particular electrical phase being measured. Each of the three TES modules TES-1, TES-2, TES-3 digitizes one electrical cycle of the filtered bus PD signal for analysis of the PD pulses, where data capture is triggered at the zero voltage/rising slope of the 60 Hz voltage signal on each respective bus 20, 22, 24. After the 1,333,333 data samples are collected for each phase, i.e. on each bus 20, 22, 24, a simple analysis, described below, is performed on the collected data to determine the origin of each PD pulse.

The GES modules detect and respond to all "detected" PD pulses, which comprises PD pulses from all sources on the particular bus 20, 22, 24 associated with a respective GES module GES-1, GES-2, GES-3. The GES modules GES-1, GES-2, GES-3 respond to the "detected" bus pulses by generating a time delayed "marker pulse" which is then injected back onto the same isophase bus 20, 22, 24 via the same bus coupler. The term "detected", as used herein, means that a set threshold pulse voltage level has been exceeded. Further, it should be understood that the GES modules also include an 80 MHz clock for timing the marker pulse delay. Each of the GES modules may include its own clock, having the same frequency as an associated TES module, or each GES module may receive the clock signal from the associated TES module. It should be noted that if individual clocks are used for the TES and GES modules, there will be a variation of plus-or-minus one clock pulse variation between the TES and GES modules. Such a variation may be acceptable if a window for validating the arrival of a marker pulse (as discussed further below) from a GES module at the associated TES module is large enough to accommodate this variation.

For the purpose of the present description, it should be noted that the GES modules GES-1, GES-2, GES-3 on each isophase bus 20, 22, 24 are separated from the respective TES modules TES-1, TES-2, TES-3 a distance, D, of 12.5 meters (FIG. 1). Electrical pulses travel through the buses 20, 22, 24 at about 70% the speed of light, such that the spacing between the respective GES and TES modules corresponds to a signal transit time of approximately 60 nS or 5 ts( ).

For the purposes of describing this embodiment, the configuration and operation of the isophase bus channel for the first isophase bus 20, will be described, and it should be understood that the configuration and operation of the other two isophase bus channels for the isophase buses 22 and 24 is substantially similar. Each time the GES Module GES-1 detects a PD pulse of unknown origin at this bus site, i.e., detects a PD pulse that exceeds a predetermined voltage threshold, a marker pulse with a predetermined amplitude is generated on the isophase bus 20 through the coupler associated with the GES-1 module precisely 50 clock pulses later (a 50*ts( ) second delay). It should be noted that PD pulses are relatively infrequent events, where an active site may generate about 20 pulses in a 60 Hz cycle, with each pulse length being approximately 100 nanoseconds. The time delay of 50*ts( ) second for generating the marker pulse is determined to be the time required for ensuring that the initiating PD pulse has completely passed, or decreased below the predetermined threshold voltage. Hence, the GES-1 module functions as a time delayed pulse repeater, providing a marker pulse for each detected PD pulse. In addition, the amplitude of the PD pulse is typically a few millivolts, and the predetermined amplitude of the marker pulse is also set to a few millivolts and may be used to provide real time calibration of every PD pulse detected at the TES-1 module.

Continuing to consider the phase channel defined by the first GES-1 module, the TES-1 module and first bus 20, specific examples of the operation of a phase channel will be provided. In considering the examples that follow it should be understood that the TES-1 module produces a data array for this electrical phase channel consisting of 1,333,333 integers, identified here as vs(1), vs(2), vs(3), vs(4), . . . , vs(1,333,333), and representing pulse voltage amplitudes at designated times ts(1), ts(2), ts(3), ts(4), . . . , ts(1,333,333), respectively. A TES pulse is indicated in the data array, i.e., a PD pulse or a marker pulse is detected by the TES-1 module, at ts(n) if vs(n) exceeds the set or predetermined threshold. It should be noted that for every PD pulse detected by the TES-1 module, the GES-1 module will also detect the PD pulse and generate an associated marker pulse which is also detected and measured by the TES-1 module. Each time a PD pulse is indicated in the data array produced by the TES-1 module, a single test is performed by the PMD 10 resulting in the recognition of this PD pulse as originating from the generator, or originating elsewhere.

As noted above, PD pulses are rare events because they are not numerous (approximately 20 per 60 Hz cycle), and exist for such a short period of time (100 nanoseconds). It may be noted that in an active pulse discharge condition, typically only about 150 ts( )'s of the 1,333,333 data points per 60 Hz electrical cycle are "non-zero", meaning that the ts( )'s are above the predetermined threshold, indicating a pulse is present in this digitization time slot. Hence, it is extremely unlikely that two PD pulses will occur in the same ts( ) time slot, or even be positioned close together, such that each PD pulse and marker pulse may be identified as a distinct event in the data array.

Figure 2:
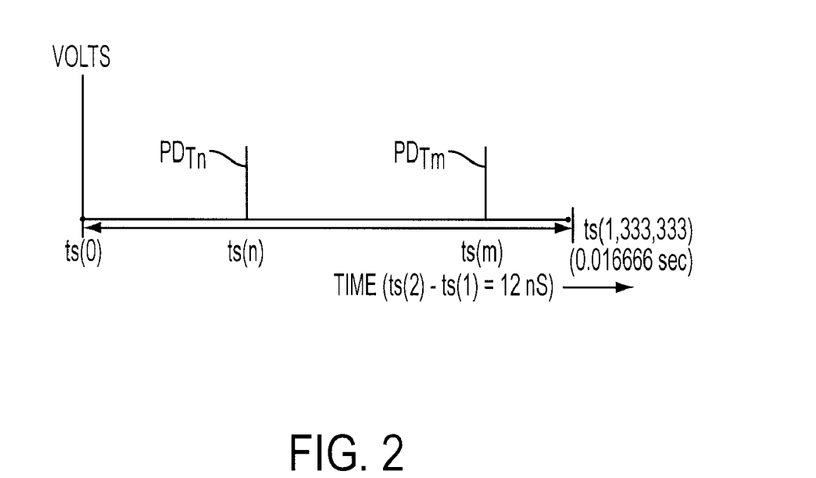
FIG. 2 is a time plot illustrating two partial discharge pulse events occurring during one electrical cycle on a first isophase bus of the system.

FIG. 2 illustrates an example in which two detected pulses $PD_{Tn}$ and $PD_{Tm}$ are identified in one 60 Hz cycle time period from ts(0) to ts(1,333,333) where, for the present example, $PD_{Tn}$ corresponds to a PD pulse originating at the generator 14 and $PD_{Tm}$ corresponds a PD pulse originating at the transformer 16. It should be noted that on the time scale of FIG. 2, the respective marker pulses are not depicted, and that the oldest time ts(0)=0 sec is at the extreme left on the x-axis, and the newest time ts(1,333,333)=0.0166666 sec is on the extreme right.

Figure 3:
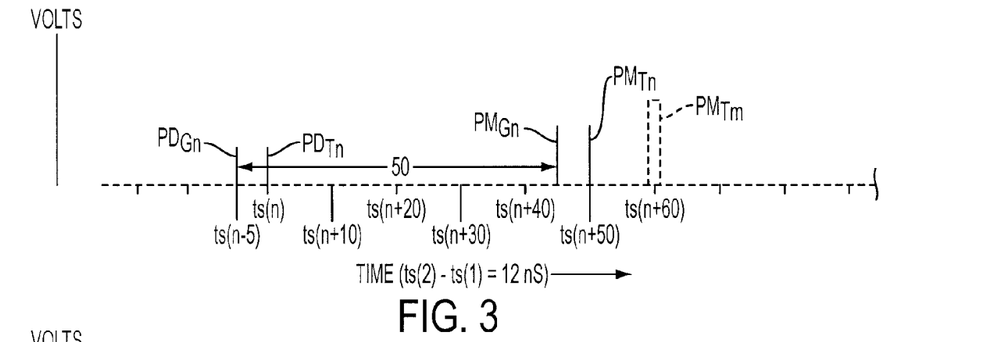
FIG. 3 is a time plot illustrating a first one of the partial discharge pulse events of FIG. 2 including a corresponding marker pulse indicating an origin of the partial discharge pulse at the generator.

Referring to FIG. 3, the condition of a PD pulse, $PD_{Tn}$, originating at the generator 14 is illustrated. In determining the origination location of a PD pulse, the PMD 10 checks for the presence of a TES marker pulse at ts(n+50), corresponding to a PD pulse, $PD_{Tn}$ originating at the generator 14, and/or a TES marker pulse at ts(n+5+50+5)=ts(n+60), corresponding to a PD pulse, $PD_{Tm}$, originating at the transformer 16. As seen in FIG. 3, a TES pulse $PD_{Tn}$ (PD pulse) is illustrated as being detected by the TES-1 module at ts(n), and a TES pulse $PM_{Tn}$ (marker pulse) is illustrated as being detected by the TES-1 module at ts(n+50). At this point it should be recalled that the transit time for a pulse to travel from the GES-1 module to the TES-1 module is 5 ts( ), such that the PD pulse is detected at the GES-1 module at ts(n−5), indicated by pulse $PD_{Gn}$ in FIG. 3, and the GES-1 module generates the marker pulse on the bus 20 at ts(n−5+50). Thus, the PD pulse arrives at and is detected by the GES-1 module prior to it being detected by the TES-1 module 5 ts( ) later.

The arrival of the marker pulse, $PM_{Tn}$, at the TES-1 module at ts(n−5+50+5)=ts(n+50), i.e., at a time following arrival of the PD pulse, $PD_{Tn}$, and equal to the delay time, i.e., a differential value of 50 clock pulses between arrival of the PD pulse and the marker pulse at the TES-1 module, indicates that the PD pulse originated at the generator 14. As discussed further below, if the PD pulse had first arrived at TES-1, then traveled to GES-1, i.e., had originated at the transformer 16, the marker pulse would have been found at ts(n+60), identified in FIG. 3 at $PM_{Tm}$. The absence of a marker pulse at ts(n+60) thus verifies that the identification of the TES pulse at ts(n) is the PD pulse, $PD_{Tn}$, that originated from the generator 14. This PD pulse is retained and applied in further processing as a generator partial discharge pulse, in manner known in the art, for monitoring and/or determining a condition of the generator 14. Note that if no marker pulse is found at ts(n+50) or ts(n+60), then the pulse at t(n) is identified as a marker pulse associated with a prior PD pulse, and is consequently disregarded.

Figure 4:
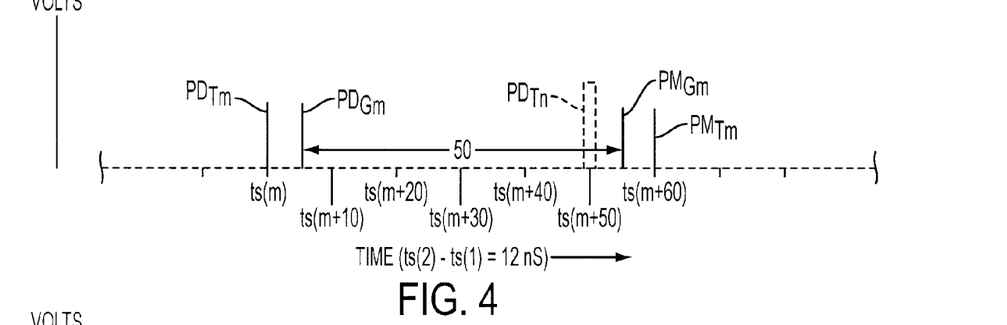
FIG. 4 is a time plot illustrating a second one of the partial discharge pulse events of FIG. 2 including a corresponding marker pulse indicating an origin of the partial discharge pulse at the transformer.

Referring to FIG. 4, the condition of a PD pulse, $PD_{Tm}$, originating at the transformer 16 is illustrated. As noted above, when a marker pulse is not detected at ts(m+50) (at $PD_{Tn}$ in FIG. 4), this is an indication that the PD pulse did not first arrive at the GES-1 module and then travel to TES-1 module. For example, this may indicate that the PD pulse originated at a location adjacent to the TES-1 module, i.e., at the transformer 16, such that it arrived at the TES-1 module (at $PD_{Tm}$) prior to arriving at the GES-1 module (at $PD_{Gm}$). This can be confirmed by checking for a marker pulse, $PM_{Tm}$, at ts(m+5+50+5)=ts(m+60), comprising a differential value of 60. If a marker pulse, $PM_{Tm}$, is detected by the TES-1 module at ts(m+60), this confirms that the PD pulse first arrived at the TES-1 module at ts(m) (at $PD_{Tm}$), took 5*ts( ) second to travel to the GES-1 module, where a marker pulse was generated 50*ts( ) second later (at $PM_{Gm}$), and the marker pulse taking an additional 5*ts( ) second to travel back to the TES-1 module (at $PM_{Tm}$), requiring a total of ts(m+60) second from the time that the PD pulse is detected at the TES-1 module. PD pulses having this test outcome comprise a set of results that are filtered out from the data array, such that only the set of data corresponding to PD pulses originating at the generator 14 are retained for analysis of the generator condition.

Figure 5:
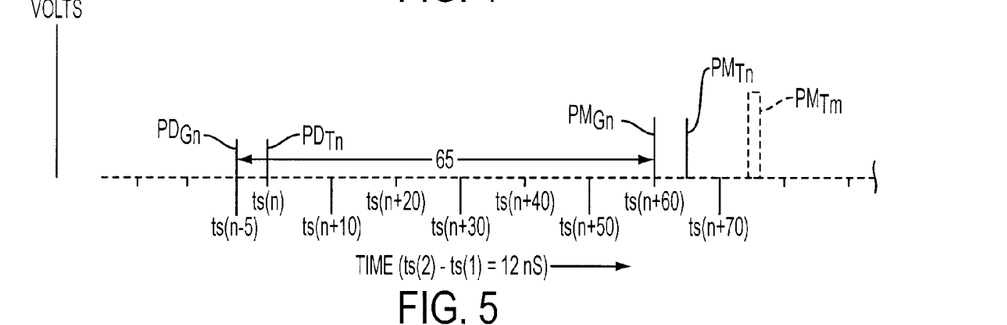
FIG. 5 is a time plot illustrating a partial discharge pulse event and corresponding marker pulse located on a second isophase bus and originating at the generator.
Figure 6:
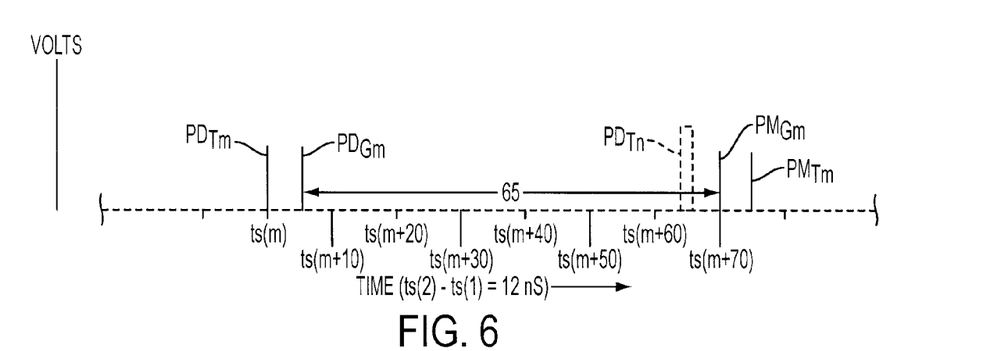
FIG. 6 is a time plot illustrating a partial discharge pulse event and corresponding marker pulse located on the second isophase bus and originating at the transformer.

As noted above, the configuration and operation of each of the second and third isophase bus channels for the isophase buses 22 and 24 is substantially similar to that of the first isophase bus channel for the isophase bus 20. However, in a preferred implementation of the first embodiment, the delay for generating the marker pulse on each of the first, second and third buses 20, 22, 24 is different for each bus 20, 22, 24 in order to avoid problems that may result from cross-talk in the conductor 18. Specifically, as seen in FIG. 5, the GES-2 module will generate a marker pulse of a predetermined amplitude on the second bus 22 at a time delay of 65 clock pulses (at $PM_{Gn}$) after a PD pulse is detected at the GES-2 module (at $PD_{Gn}$). The TES-2 module analyzes the pulse signals received on the second bus 22 to determine the origin of a PD pulse, where a marker pulse, $PM_{Tn}$, received at the TES-2 module at time ts(n+65) corresponds to a PD pulse, $PD_{Tn}$, received at the TES-2 module at time ts(n), and indicating a PD pulse originating at the generator 14. Also, a check is performed to determine if a marker pulse has been received at a time delay of ts(n+75) (at $PM_{Tm}$) corresponding to a PD pulse that originated at the transformer 16. As discussed above with regard to the first isophase channel of bus 20, if a PD pulse originates at the transformer 16, the PD pulse is first detected at the TES-2 module ($PD_{Tm}$ in FIG. 6), and there is an additional 10 ts( ) delay over the delay associated with a marker pulse generated in response to a PD pulse originating at the generator 14, i.e., the delayed marker pulse arrives at TES-2 at ts(m+5+65+5)=ts(m+75).

Figure 7:
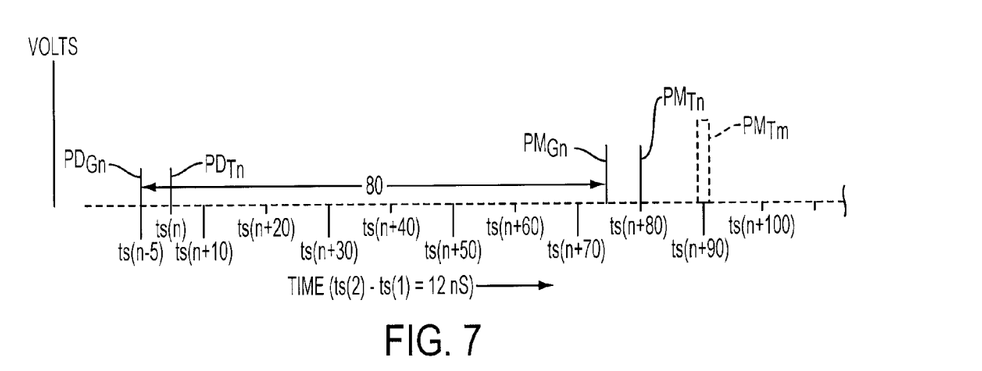
FIG. 7 is a time plot illustrating a partial discharge pulse event and corresponding marker pulse located on a third isophase bus and originating at the generator.
Figure 8:
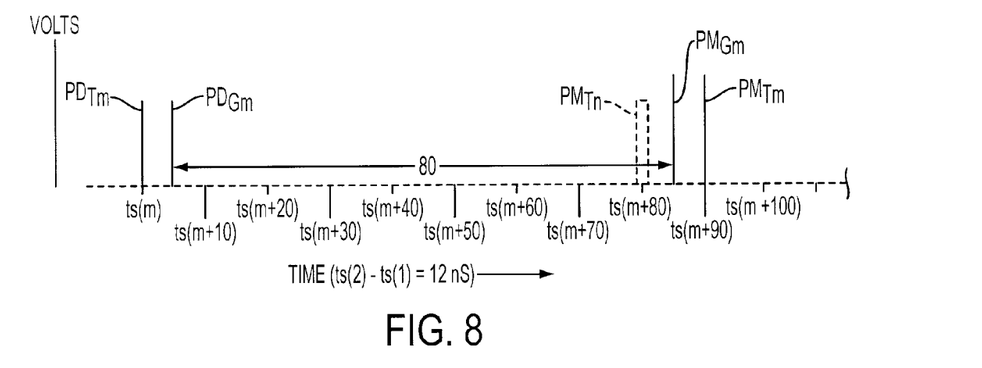
FIG. 8 is a time plot illustrating a partial discharge pulse event and corresponding marker pulse located on the third isophase bus and originating at the transformer.

Similarly, with reference to FIG. 7, the GES-3 module will generate a marker pulse of a predetermined amplitude on the third bus 24 at a time delay of 80 clock pulses (at $PM_{Gn}$) after a PD pulse is detected at the GES-3 module (at $PD_{Gn}$). The TES-3 module analyzes the pulse signals received on the third bus 24 to determine the origin of a PD pulse, where a marker pulse $PM_{Tn}$ received at the TES-3 module at time ts(n+80) corresponds to a PD pulse $PD_{Tn}$ received at the TES-3 module at time ts(n), and indicating a PD pulse originating at the generator 14. Also, a check is performed to determine if a marker pulse has been received at a time delay of ts(n+90) (at $PM_{Tm}$) corresponding to a PD pulse that originated at the transformer 16. If a PD pulse originates at the transformer 16, the PD pulse is first detected at the TES-3 module ($PD_{Tm}$ in FIG. 8), and there is an additional 10 ts( ) delay over the delay associated with a marker pulse generated in response to a PD pulse originating at the generator 14, i.e., the delayed marker pulse arrives at TES-3 at ts(m+5+80+5)=ts(m+90).

The marker pulse generated at each of the GES modules is of a known amplitude and the amplitude of each marker pulse is measured by the respective TES module. Hence, the marker pulse associated with each PD pulse may be used to calibrate the associated PD pulse and thereby provide a substantially known measure of the magnitude of the PD pulse.

The resulting analysis of the data arrays at each of the TES-1, TES-2 and TES-3 modules is output to the remote I/O unit 26, such as for display, storage and/or further processing.

Figure 9:
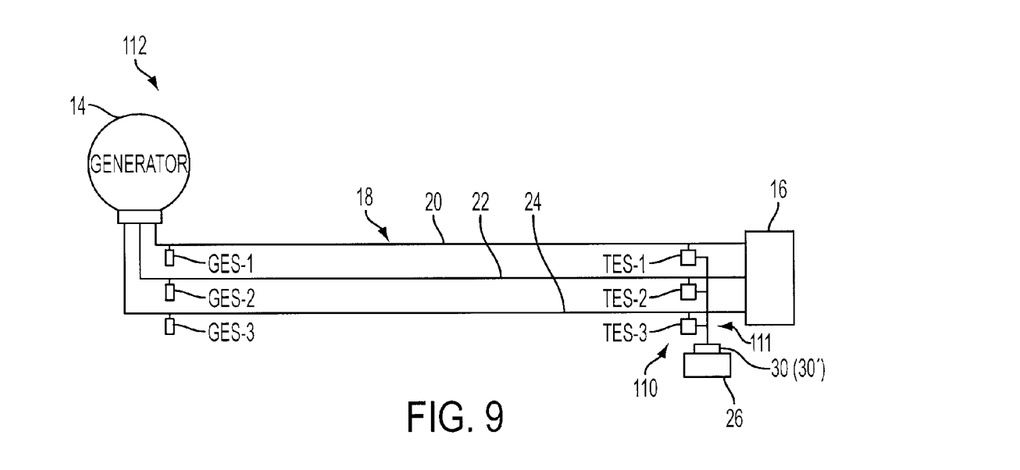
FIG. 9 is a time plot of partial discharge events occurring on the first, second and third isophase buses and including two partial discharge pulse events occurring during one electrical cycle on the second and third isophase buses.

In a second embodiment of the invention, the analog signals from all three TES modules are summed, forming a single combined analog signal which is then processed by a single high speed digitizer. Referring to FIG. 9, a system 112 including a PMD 110 similar to the system 12 of FIG. 1 is shown, with the exception that the TES modules do not include a digitizer board and the outputs from the TES modules are input into a common high speed digitizer board 30 that may be located at the I/O unit 26. The TES modules and digitizer 30 define an analyzer unit 111.

The data collected at the TES modules forms a single combined data array which is filtered and then digitized at the digitizer 30. The filtering performed at the TES modules comprises removal of low frequencies, such as the 20 kV, 60 Hz signals that are present on each isophase bus. Most of this 60 Hz signal is removed by the bus coupler. In addition, one or more notch filters may be used to remove continuous wave signals, such as may be related to radio, TV, or similar emissions.

Figure 10:
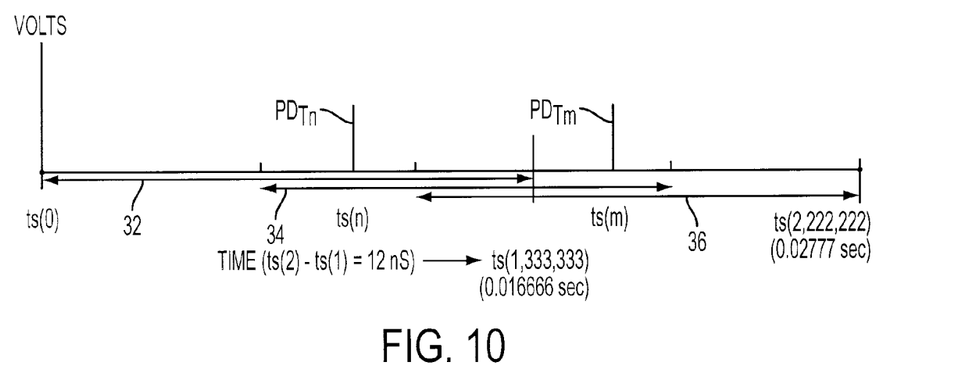
FIG. 10 is a diagrammatic view of a power plant system illustrating second and third embodiments of the marker pulse discriminator monitor for performing the present invention.

FIG. 10 illustrates a single combined data array received from TES-1, TES-2 and TES-3 corresponding to three complete electrical cycles collected from each the three buses 22, 24 and 26, and including two PD pulses of unknown origin for illustrative purposes. The three cycles are identified in FIG. 10 as spanning overlapping time periods 32, 34 and 36 corresponding to the electrical cycles on the respective buses 20, 22 and 24. It may be seen that the combined data array spans five-thirds cycles of data. That is, the data array spans 2,222, 222 points, i.e., extends to ts(2,222,222), since a complete electrical cycle is collected for each electrical phase (bus), starting at the zero voltage, rising slope point of each 60 Hz electrical phase.

In this embodiment, the PMD 110 operates to identify the originating location for a PD pulse, as well as identify which isophase bus each PD pulse comes from. As with the previous embodiment, the GES modules associated with each bus 20, 22, 24 provide a marker pulse at a distinct delay time, such that the GES-1 module generates a marker pulse at ts(n+50), the GES-2 module generates a marker pulse at ts(n+65) and the GES-3 module generates a marker pulse at ts(n+80). Hence, when the PMD 110 analyzes the combined data array and a PD pulse is identified at ts(n), the presence of a corresponding marker pulse at ts(n+50) indicates that the PD pulse is from the first bus 20, the presence of a corresponding marker pulse at ts(n+65) indicates that the PD pulse is from the second bus 22, and the presence of a corresponding marker pulse at ts(n+80) indicates that the PD pulse is from the third bus 24.

In addition, the origin of the PD pulse on the bus 20, 22, 24, i.e., an origin at either the generator 14 or the transformer 16, may be determined in a manner similar to that described above for the first embodiment with reference to FIGS. 3-8. For example, with reference to the two pulses illustrated in FIG. 10, the pulse $PD_{Tn}$ may correspond to a pulse event from the second bus 22 and originating at the generator 14, as characterized by FIG. 5, and the pulse $PD_{Tm}$ may correspond to a pulse event from the third bus 24 and originating at the transformer 16, as characterized by FIG. 8.

Figure 11:
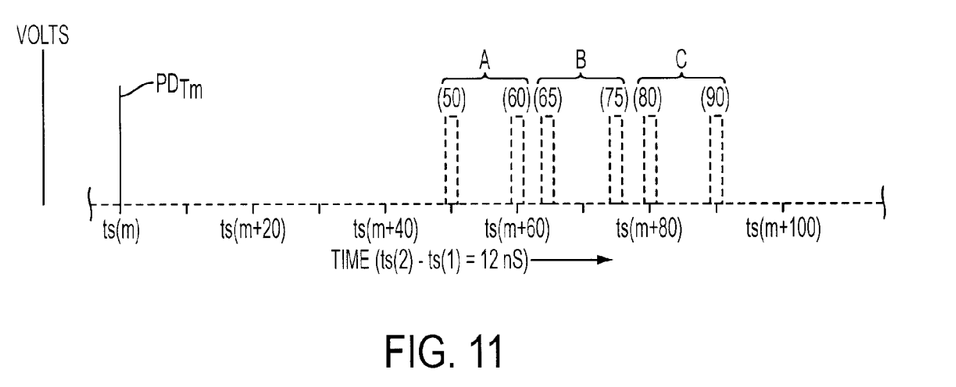
FIG. 11 is a time plot showing a summary of the marker pulses that may be used to distinguish the bus conveying a PD pulse event and to identify the origin location of the PD pulse event.

FIG. 11 shows a summary of the marker pulses that may be used to identify a PD pulse event, $PD_{Tm}$, from the three buses 20, 22, 24. Specifically, the marker pulses identified by A would be identified as coming from the first bus 20, the marker pulses identified by B would be identified as coming from the second bus 22, and the marker pulses identified by C would be identified as coming from the third bus 24. Further, the first marker pulses from each of A, B and C, identified by differential values 50, 65 and 80, comprise a predefined set of marker pulses identifying PD pulses originating at the generator 14, and the second marker pulses from each of A, B and C, identified by differential values 60, 75 and 90, comprise a predefined set of marker pulses identifying PD pulses originating at the transformer 16.

In a third embodiment comprising a modification to the second embodiment of the PMD 110 described with reference to FIG. 9, the digitizer 30 may be replaced with an elapsed time determining unit 30', such as a clock/peak-capture circuit, that determines an elapsed time, or differential value, between arrival of a PD pulse and arrival of a marker pulse. In this embodiment, a trigger in the TES modules for responding to PD pulses and marker pulses causes an 80 MHz clock to be read in response to detected PD pulses and marker pulses, providing a time indication for each detected pulse with the same resolution as that provided in the second embodiment. The associated peak capture circuit is opened at this time thus capturing the pulse amplitude (in volts). For each electrical cycle of data analyzed, there will be approximately 2*n*x=320 numbers, where each detection comprises two pulses (PD pulse and marker pulse), n represents the number of PD pulses detected in one electrical cycle (i.e., approximately 20 PD pulses in this example), and x is the approximate width of a PD pulse (measured in ts( )'s). Hence, the data array in this embodiment is much smaller in comparison to the data array of a cycle in the second embodiment in that all numbers with a "zero" value (undetected numbers) are missing from the current data array. That is, the data array for this modified embodiment may have approximately 1,333,031 less numbers than the 1,333,333 data array for one electrical cycle analyzed by a digitizer. The reduced quantity of numbers in the data array would be conducive to real time analysis of the data.

The data array for this modified embodiment includes data from all three buses and may be analyzed in a manner similar to that described for the second embodiment in that the data array may be analyzed to distinguish between those differential values indicative of PD pulses originating at the generator 14 and those differential values indicative of PD pulses originating at the transformer 16. In addition, the particular buses that the PD pulses originate from would also be determined based on the differential values, as described above with regard to the second embodiment and with reference to FIG. 11.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for detecting partial discharge pulses emanating from a generator on a conductor, the method comprising the steps of:

detecting a partial discharge pulse on the conductor at a first module;

detecting the partial discharge pulse on the conductor at a second module;

generating a marker pulse on the conductor at the first module in response to the detection of the partial discharge pulse at the first module;

detecting the marker pulse on the conductor at the second module;

determining a differential value corresponding to a difference between a time of arrival of the partial discharge pulse at the second module and a time of arrival of the marker pulse at the second module; and using the differential value to identify whether the partial discharge pulse originated at the generator.

2. The method of claim 1, wherein the marker pulse is generated by the first module a predetermined time period after the partial discharge pulse is detected at the first module.

3. The method of claim 2, wherein the second module identifies a partial discharge pulse originating at the generator by identifying a differential value corresponding to the predetermined time period.

4. The method of claim 1, wherein the first module is located adjacent to the generator.

5. The method of claim 1, wherein the second module is located adjacent to a step-up transformer.

6. The method of claim 5, wherein the first and second modules are located between the generator and the step-up transformer, and including identifying a partial discharge pulse originating from the step-up transformer comprising:

detecting the partial discharge pulse at the second module before detecting the partial discharge pulse at the first module;

identifying a differential value equal to the sum of the predetermined time period and approximately twice the time period required for a pulse to travel between the first and second modules.

7. The method of claim 1, wherein the conductor comprises first, second and third isophase buses, each isophase bus connected to a respective first module, and the step of generating a marker pulse on the conductor comprises providing a unique time delay for each first module to produce a marker pulse after a partial discharge pulse is detected on a respective isophase bus.

8. The method of claim 7, including an analyzer unit comprising the second module and connected to all of the isophase buses, and the analyzer unit identifies the isophase bus associated with a partial discharge pulse based on a differential value corresponding to at least one unique time delay provided by at least one of the first modules.

9. In a system comprising an electrical generator connected to a step-up transformer by a conductor comprising a plurality of isophase buses, and a monitor comprising a plurality of first modules connected to respective isophase buses adjacent to the generator and an analyzer unit including one or more second modules connected to the isophase buses adjacent to the step-up transformer, a method for detecting partial discharge pulses emanating from the generator, the method comprising the steps of;

detecting one or more partial discharge pulses at respective first modules;

detecting the one or more partial discharge pulses at the analyzer unit;

generating a marker pulse for each of the one or more partial discharge pulses at the respective first modules;

detecting each marker pulse at the analyzer unit;

for each marker pulse, determining a differential value corresponding to a difference between a time of arrival of the partial discharge pulse at the analyzer unit and a time of arrival of a corresponding marker pulse at the analyzer unit; and using each differential value to identify whether a corresponding partial discharge pulse originated at the generator and to identify the isophase bus associated with the corresponding partial discharge pulse.

10. The method of claim 9, wherein each of the marker pulses is generated a predetermined time period after a partial discharge pulse is detected on a respective isophase bus, and each first module has a unique predetermined time period associated with it different from the predetermined time period of any other first module.

11. The method of claim 9, wherein partial discharge pulses originating at the generator are identified by a first predefined set of differential values, and discharge pulses originating from the step-up transformer are defined by a second predefined set of differential values.

12. The method of claim 9, wherein analog pulse signals from all isophase buses are combined into a single analog signal, where the single analog signal comprises five-thirds electrical cycles of data.

13. The method of claim 12, wherein the single analog signal is digitized for analysis by the analyzer.

14. The method of claim 9, wherein analog pulse signals from all isophase buses are analyzed in real time based on an elapsed time between arrival of a partial discharge pulse and arrival of a marker pulse.

15. The method of claim 9, wherein the amplitude of each marker pulse is used to analyze the amplitude of a corresponding partial discharge pulse.

16. In combination with a system comprising an electrical generator connected to a step-up transformer by a conductor comprising a plurality of isophase buses, a monitor for detecting partial discharge pulses emanating from the generator, the monitor comprising:

a plurality of first modules connected to respective isophase buses adjacent to the generator, each of the first modules generating a marker pulse in response to a partial discharge pulse;

an analyzer unit including one or more second modules connected to the isophase buses adjacent to the step-up transformer; and wherein the analyzer unit receives each partial discharge pulse and each marker pulse and determines a differential value corresponding to a difference between a time of arrival of a partial discharge pulse and a time of arrival of a corresponding marker pulse to identify a partial discharge pulse originating at the generator and to identify the isophase bus associated with the corresponding partial discharge pulse.

17. The monitor of claim 16, wherein the analyzer unit is connected to all of the isophase buses and combines the analog pulse signals from all isophase buses into a single analog signal.

18. The monitor of claim 16, wherein the analyzer unit comprises a second module associated with each of the isophase buses, each of the second modules performing a data capture and analysis operation for detecting partial discharge pulses on a respective isophase bus.

* * * * *